(12) United States Patent
Chang et al.

(10) Patent No.: US 10,249,706 B1
(45) Date of Patent: Apr. 2, 2019

(54) SEMICONDUCTOR STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chia-Lung Chang, Tainan (TW); Wei-Hsin Liu, Changhua County (TW); Po-Chun Chen, Tainan (TW); Yi-Wei Chen, Taichung (TW); Han-Yung Tsai, Tainan (TW); Tzu-Chin Wu, Chiayi County (TW); Shih-Fang Tzou, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/951,185

(22) Filed: Apr. 12, 2018

(30) Foreign Application Priority Data

Mar. 19, 2018 (CN) .......................... 2018 1 0223603

(51) Int. Cl.
*H01L 49/02* (2006.01)
*H01L 27/108* (2006.01)

(52) U.S. Cl.
CPC ........ *H01L 28/90* (2013.01); *H01L 27/10805* (2013.01); *H01L 27/10852* (2013.01); *H01L 27/10897* (2013.01)

(58) Field of Classification Search
CPC ...................................................... H01L 28/90
See application file for complete search history.

(56) References Cited

U.S. PATENT DOCUMENTS

| 8,816,418 | B2 | 8/2014 | Kim | |
|---|---|---|---|---|
| 8,969,167 | B2 | 3/2015 | Yoon | |
| 9,159,729 | B2 | 10/2015 | Kim | |
| 2002/0025650 | A1* | 2/2002 | Thakur | ................. G11C 11/404 438/398 |
| 2011/0159660 | A1* | 6/2011 | Kang | ................ H01L 27/10817 438/381 |

\* cited by examiner

*Primary Examiner* — Elias Ullah
(74) *Attorney, Agent, or Firm* — Winston Hsu

(57) ABSTRACT

The present invention provides a semiconductor structure comprising a substrate, a cell region defined on the substrate, a plurality of lower electrodes of the capacitor structures located in the cell region, an top support structure, contacting a top region of the lower electrode structure, and at least one middle support structure located between the substrate and the top support structure, contacting a middle region of the lower electrode structure, wherein when viewed in a top view, the top support structure and the middle support structure do not completely overlapped with each other.

11 Claims, 11 Drawing Sheets

US 10,249,706 B1

SEMICONDUCTOR STRUCTURE

BACKGROUND OF THE INVENTION

1. Field of the Invention

The invention relates to a semiconductor structure, in particular to a semiconductor structure comprising a multi-layer support structure and a lower electrode of a capacitor structure.

2. Description of the Prior Art

Dynamic random access memory (DRAM) is a major volatile memory and is an indispensable key element in many electronic products. DRAM consists of a large number of memory cells aggregated to form an array area for storing data. Each memory cell is composed of a metal oxide semiconductor (MOS) transistor and a capacitor in series.

In general, the capacitor in the memory region has a large height (usually greater than 1.5 microns), so it has a better storage charge performance, but at the same time the higher the capacitor, the more likely the collapse of the capacitor structure occurs. Solving the above problems can effectively improve the DRAM yield and quality.

SUMMARY OF THE INVENTION

The present invention provides a semiconductor structure comprising a substrate, a cell region defined on the substrate, a plurality of lower electrodes of the capacitor structures located in the cell region, an top support structure, contacting a top region of the lower electrode structure, and at least one middle support structure located between the substrate and the top support structure, contacting a middle region of the lower electrode structure, wherein when viewed in a top view, the top support structure and the middle support structure do not completely overlapped with each other.

The present invention is characterized in that a semiconductor structure is fabricated, which at least comprises a plurality of lower electrodes of the capacitor structures, an upper support structure layer and a middle support structure layer, the upper support structure layer and the middle support structure layer respectively support the upper portion and the middle portion of a lower electrode of the capacitor structure, to prevent the lower electrode of the capacitor structure from collapsing. In addition, from the top view, the upper support structure layer and the middle support structure layer do not completely overlap with each other, thereby further enhancing function for supporting the lower electrode. In addition, during the manufacturing process, only one wet etching step (e.g., hydrofluoric acid) is performed, so damage to the lower electrode of the capacitor structure can also be reduced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
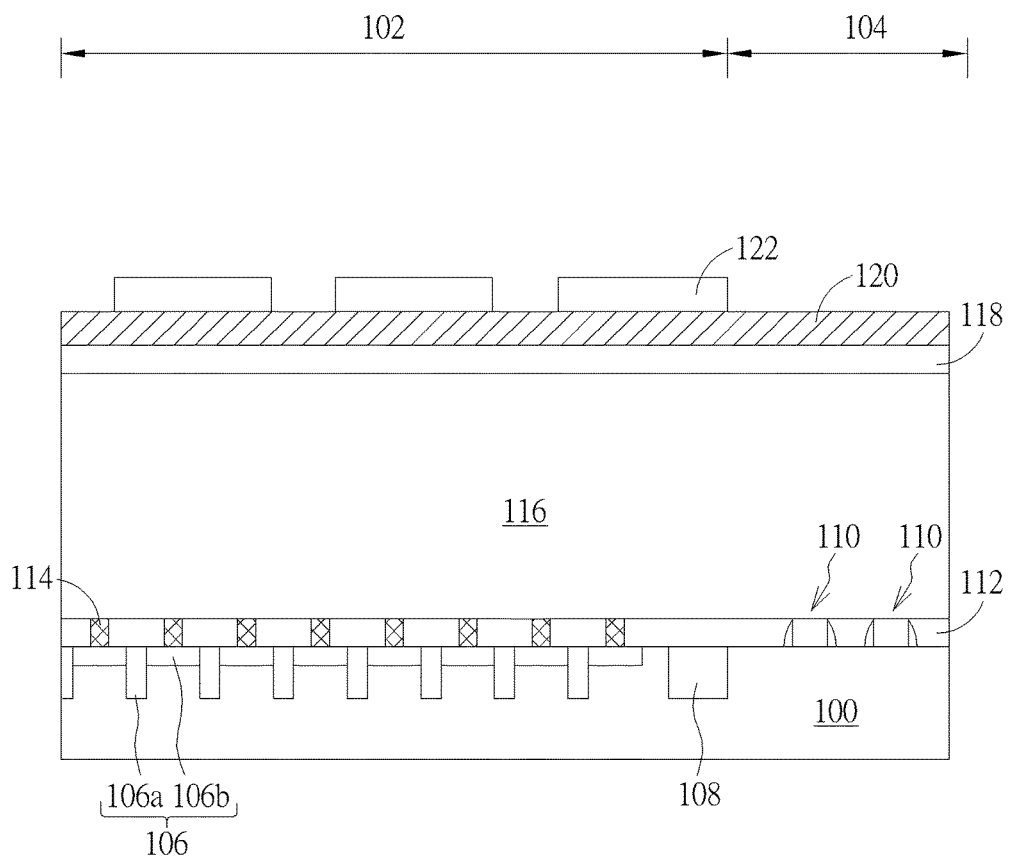
FIG. 1 to FIG. 9 illustrate the schematic diagrams of fabricating a semiconductor structure according to the present invention.

Please refer to FIG. 1 to FIG. 9, which illustrate the schematic diagrams of fabricating a semiconductor structure according to the present invention. As shown in FIG. 1, a substrate 100 is provided. At least one cell region 102 and one peripheral region 104 are defined on the substrate 100. A plurality of first transistors 106 are formed in the cell region 102, and a plurality of second transistors 110 are also included in the peripheral region 104. The first transistor 106 in the cell region 102 includes, for example, a buried word line 106 $a$ and its source/drain 106 $b$ located in the substrate 100. Besides, a single or multi-layer dielectric layer 112 and a contact structure 114 are disposed above the first transistor 106. The contact structure 114 connects the first transistor 106. In addition, a plurality of shallow trench isolations 108 are further included in the substrate of the cell region 102 and the peripheral region 104. Furthermore, other common dynamic random access memory elements may also be included here, such as bit lines, contact etch stop layers, and the like. However, it has not been drawn to simplify the drawing.

Next, still referring to FIG. 1, a stacked multilayer structure is further continued formed on the dielectric layer 112, the stacked multilayer structure includes a first oxide layer 116, a second oxide layer 118, a first support material layer 120, and a patterned photoresist layer 122. In this embodiment, the material of the first oxide layer 116 is, for example, a tetraethoxysilane (TEOS) layer or a silicon oxide layer, the second oxide layer 118 is, for example, silicon oxide. The material of the first support material layer 120 is, for example, silicon carbon nitride (SiCN), silicon nitride (SiN), silicon oxynitride (SiON), etc., the first support material layer 120 and the first oxide layers 118 have different etching selectivity. In this embodiment, the first support material layer 120 will be made into a middle support structure in the subsequent steps, which is located in a middle part of a lower electrode of the capacitor structure, and to fix the lower electrode of the capacitor structure, so as to prevent the lower electrode of the capacitor structure from collapsing. In addition, in some embodiments, the second oxide layer 118 may be omitted.

Figure 2:
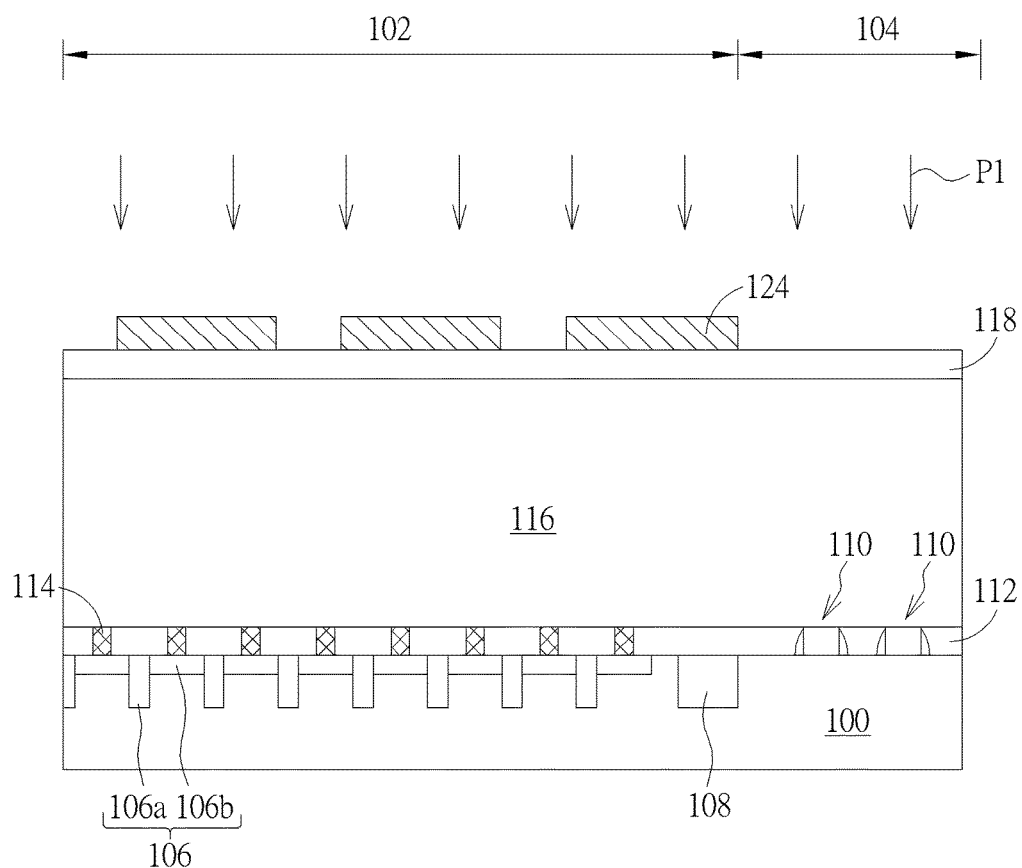

As shown in FIG. 2, using the patterned photoresist layer 122 as a mask, an etching step P1 is performed to transfer the pattern of the patterned photoresist layer 122 to the first support material layer 120 which is disposed below the patterned photoresist layer 122, to remove portion of the first support material layer 120. The remaining patterned photoresist layer 122 is subsequently removed. The remaining first support material layer 120 at this time is defined as a middle support structure layer 124.

Figure 3:
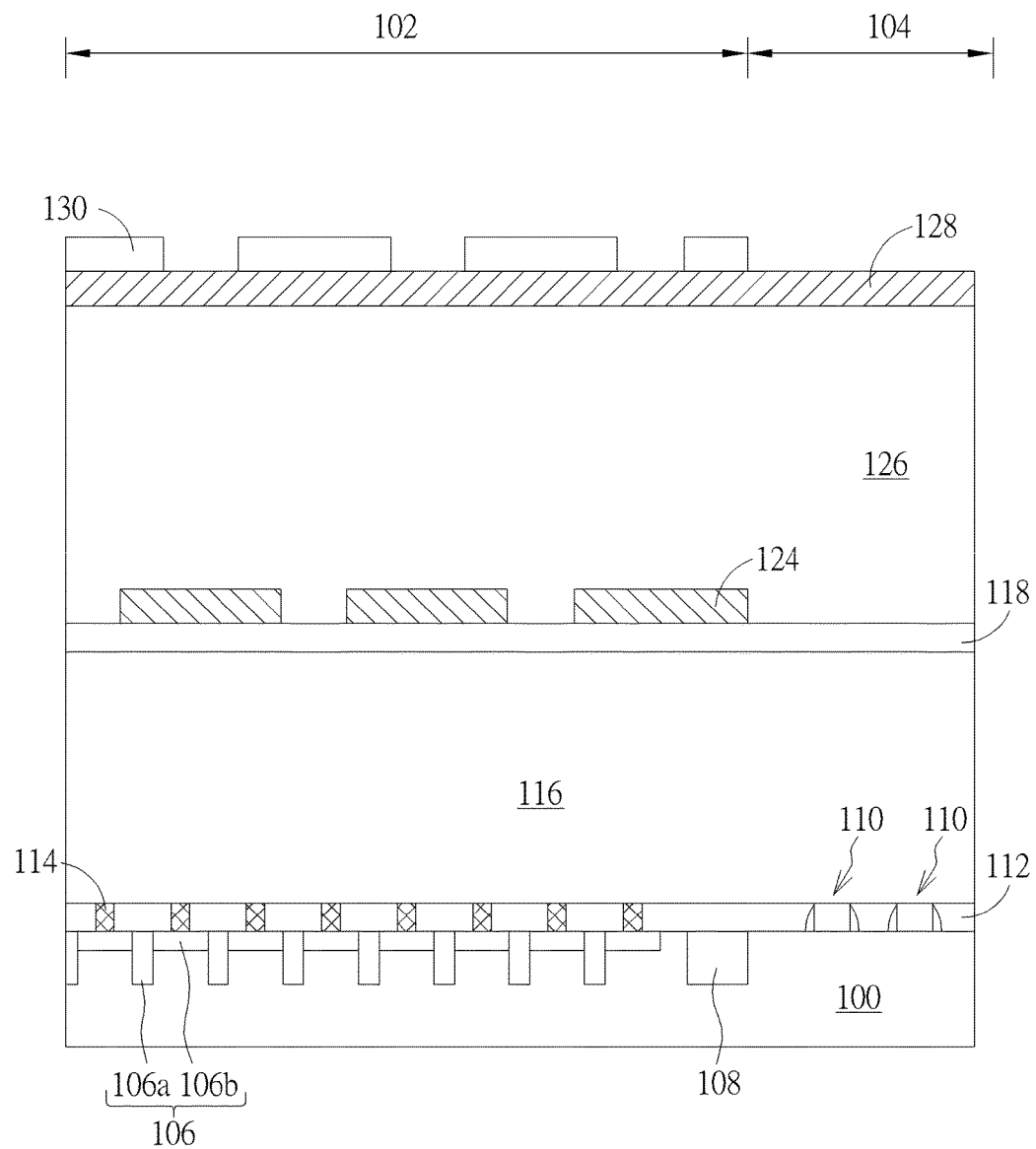

As shown in FIG. 3, a third oxide layer 126, a second support material layer 128, and a patterned photoresist layer 130 are formed on the middle support structure layer 124 and on the second oxide layer 118 in sequence. In this embodiment, the third oxide layer 126 is, for example, a silicon oxide or tetraethoxysilane (TEOS) layer, and the second support material layer 128 is, for example, silicon carbide nitride (SiCN), silicon nitride (SiN), or silicon oxynitride (SiON) etc. In this embodiment, the second support material layer 128 will be made into an upper support structure in the subsequent steps, located at a top terminal portion of a lower electrode of a capacitor structure, and the lower electrode of the capacitor structure is fixed to prevent it from collapsing.

Figure 4:
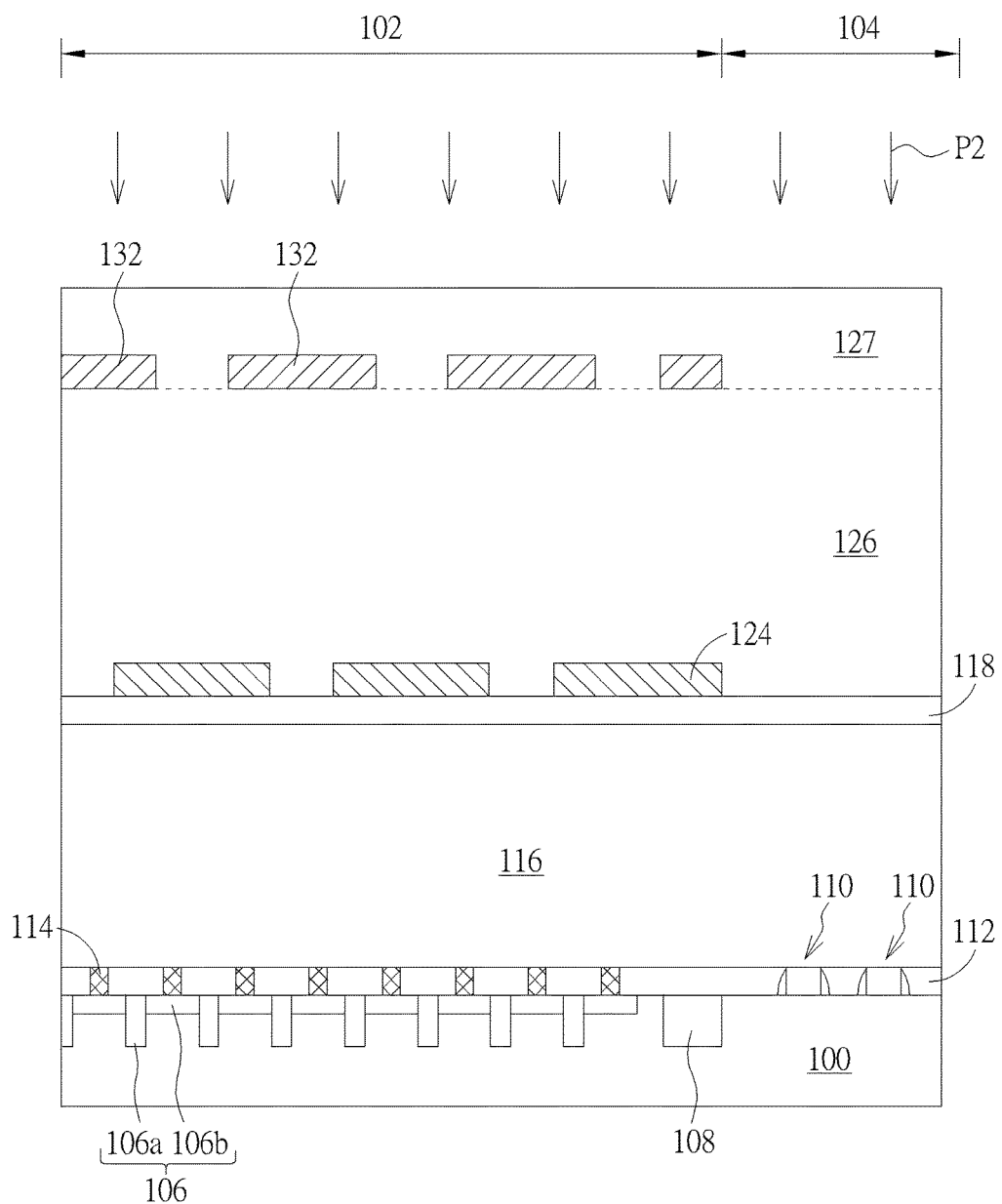
Figure 5:
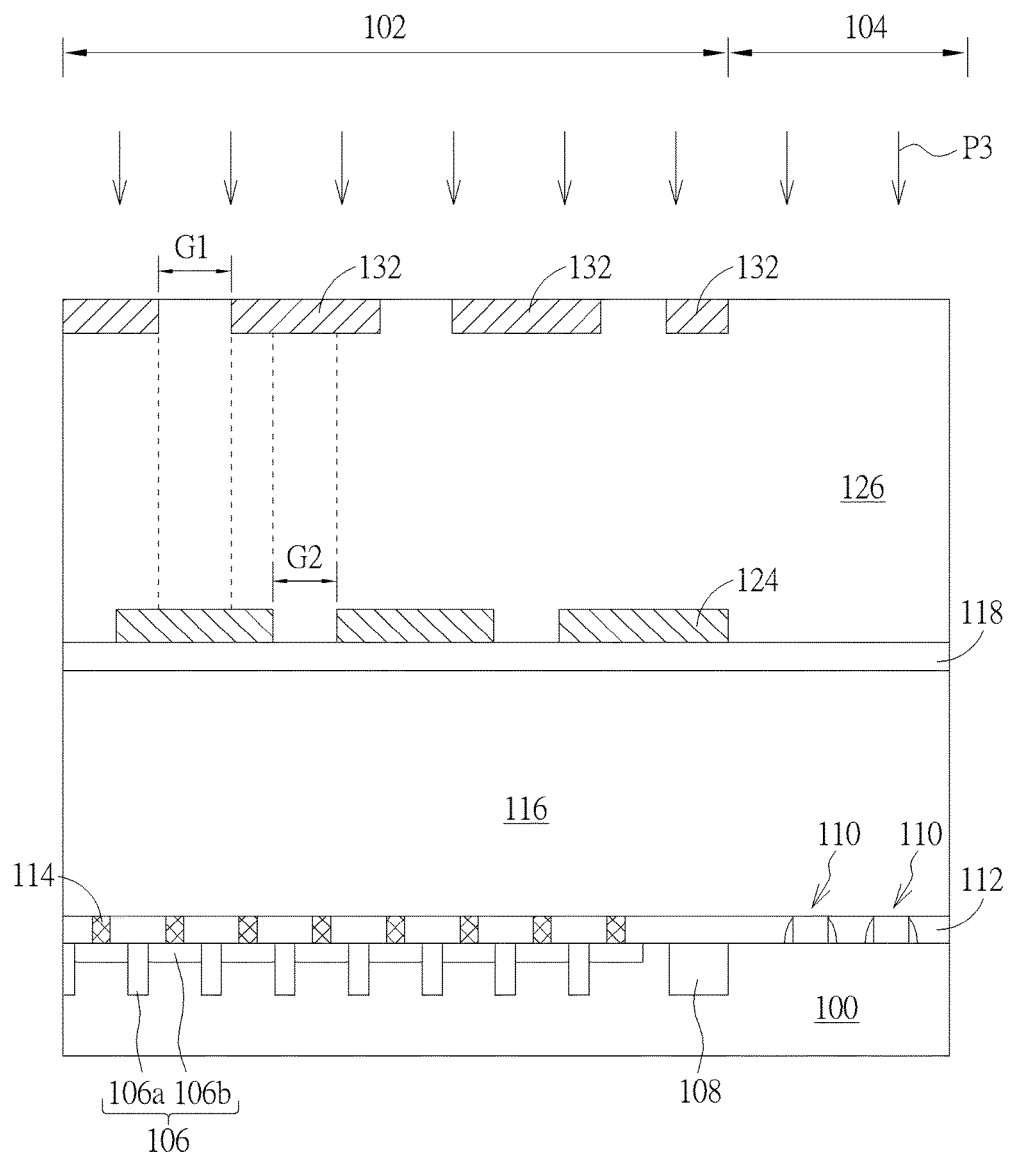

As shown in FIG. 4 to FIG. 5, using the patterned photoresist layer 130 as a mask, an etching step P2 is performed to transfer the pattern of the patterned photoresist layer 130 to the second support material layer 128 disposed below the patterned photoresist layer 130, to remove a portion of the second support material layer 128, and the remaining patterned photoresist layer 130 is then removed. The remaining second support material layer 128 at this time is defined as an upper support structure layer 132. An oxide layer 127 is then refilled to cover the upper support structure layer 132. Next, as shown in FIG. 5, a planarization step P3 is performed to remove part of the oxide layer 127 and to expose the top surface of each upper support structure layer 132, so as to form the structure shown in FIG. 5. The material of the oxide layer 127 is preferably the same as that of the third oxide layer 126, and the planarization step P3 is, for example, a chemical mechanical polishing (CMP) process.

It should be noted that in the present embodiment, both the upper support structure layer 132 and the middle support structure layer 124 do not completely overlap with each other, in other words, some of the upper support structure layers 132 are not disposed right above the middle support structure layer 124. Preferably, both the upper support structure layer 132 and the middle support structure layer 124 are staggered with one another. In the present embodiment, from the cross-sectional view, a plurality of spacers G1 are defined between each upper support structure layer 132, and the downward extension of the spacers G1 overlap the position of the middle support structure layer 124. Similarly, a plurality of spacers G2 are defined between the middle support structure layers 124, and the spacers G2 extend upwards and overlap with the positions of the upper support structures 132. As a result, after the subsequent lower electrode of the capacitor structure is formed, the upper support structure layer 132 and the middle support structure layer 124 will stagger and fix the lower electrode of the capacitor structure, so as to further enhance the function of the fixed-lower electrode of the capacitor structure.

Figure 6:
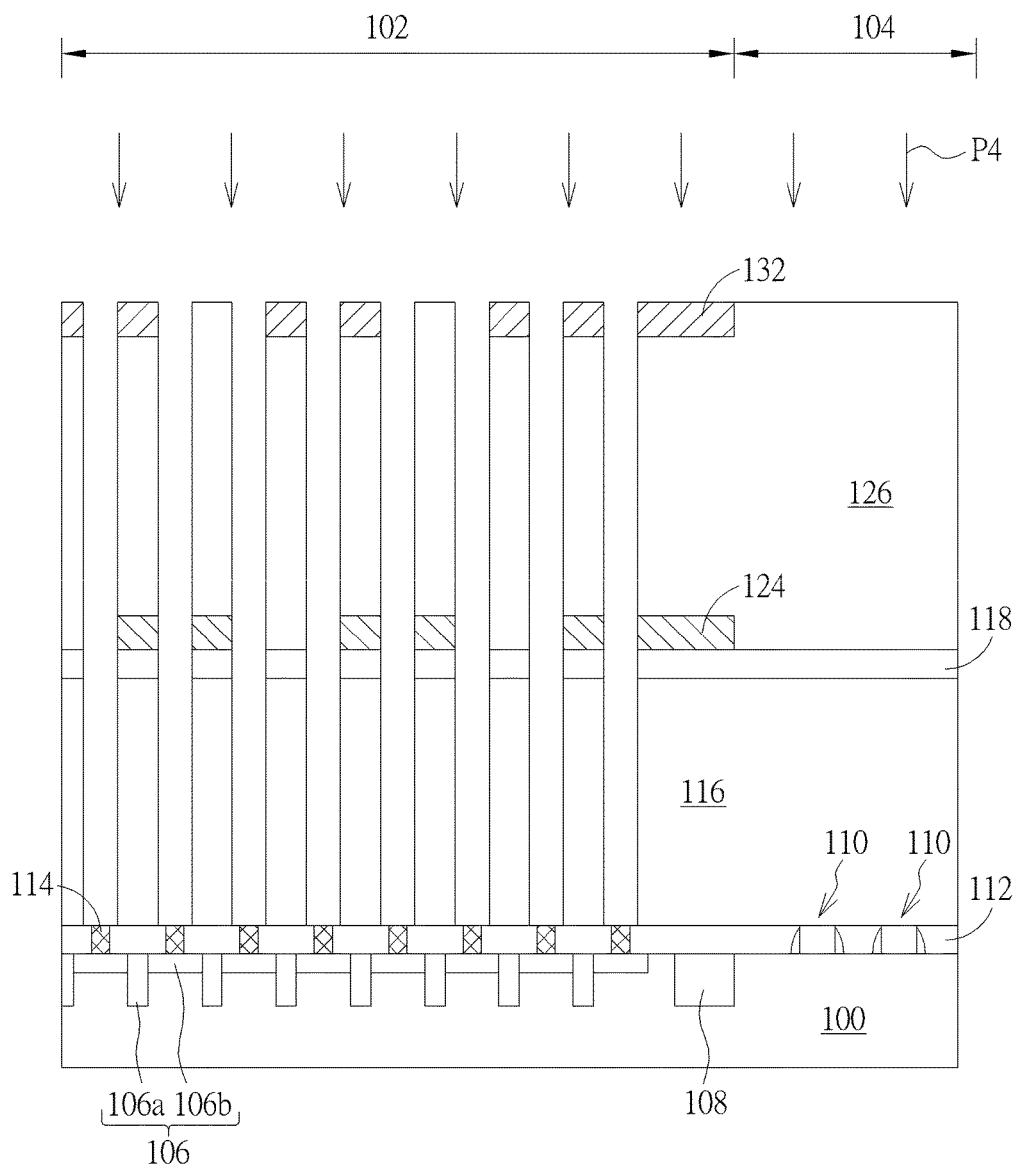

As shown in FIG. 6, an etching step P4 is performed to form a plurality of capacitor recesses 134. The etching step P4 includes forming a single or multi-layered mask layer (not shown) on the surface of the upper support structure layer 132, and then sequentially removing portion of the upper support structure layer 132, portion of the oxide layer 126, portion of the middle support structure layer 124, portion of the second oxide layer 118 and portion of the first oxide layer 116 that are exposed by multiple etching steps, until the underlying contact structure 114 is exposed. Here, each of the capacitor recess 134 corresponds to the position of the subsequently formed lower electrode of the capacitor structure.

Figure 7:
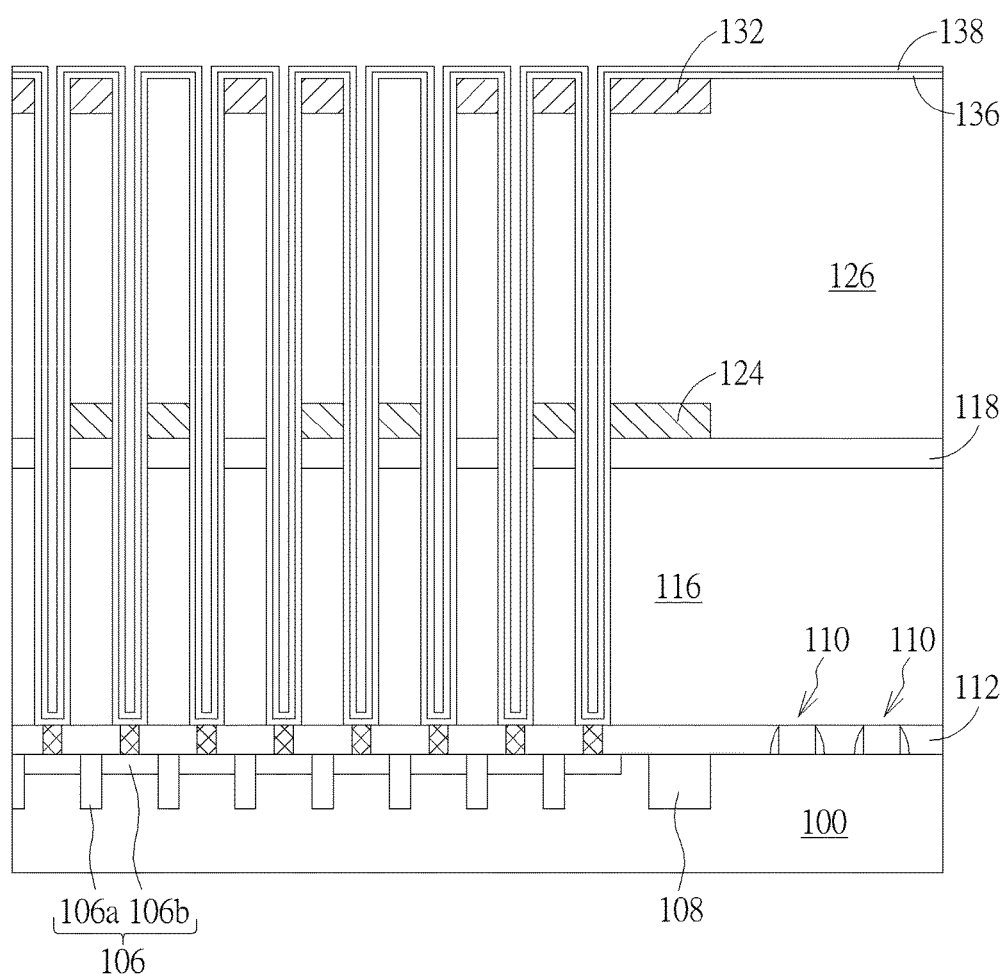
Figure 8:
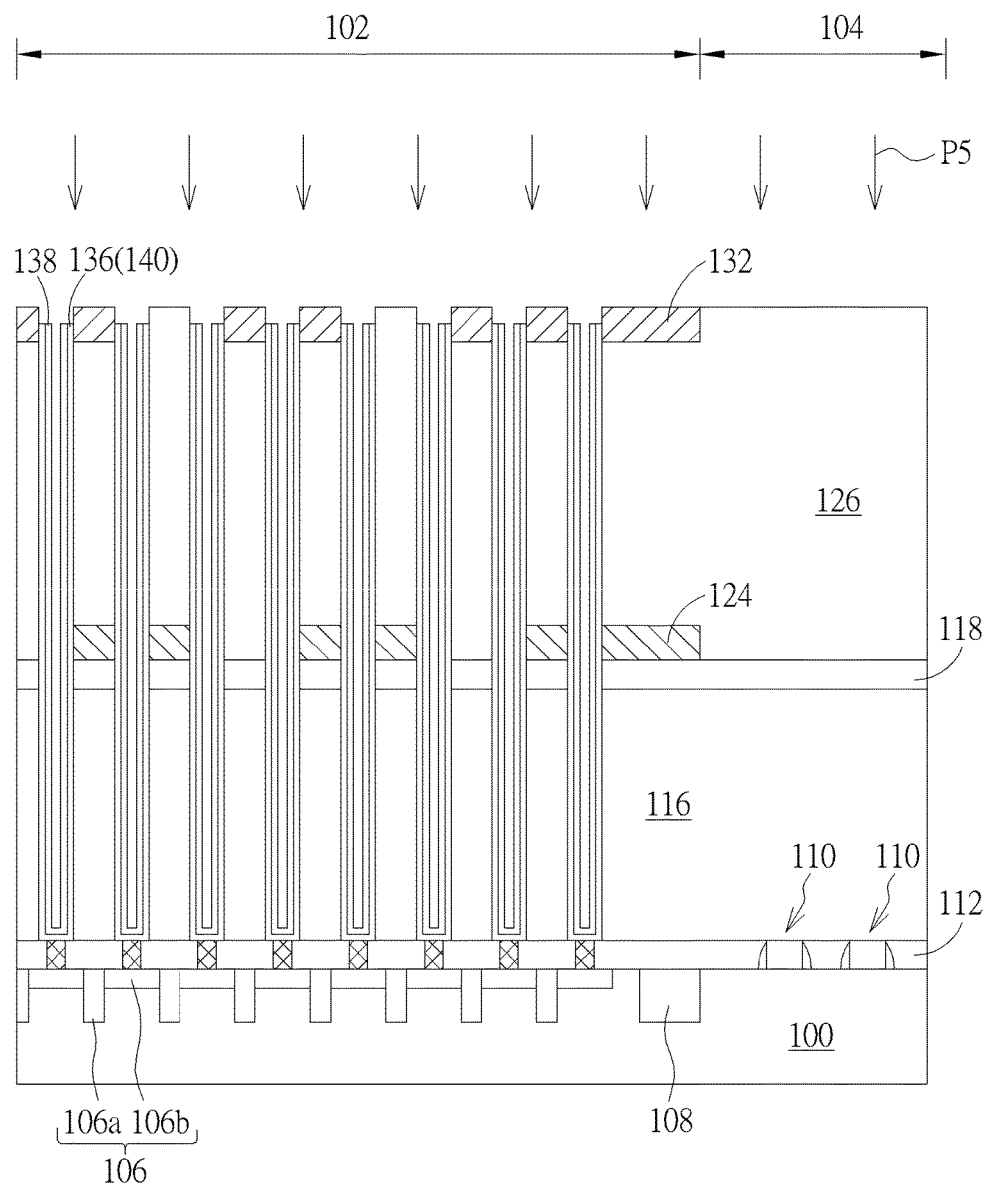

Referring to FIG. 7 to FIG. 8, as shown in FIG. 7, an electrode material layer 136 and a protection layer 138 are sequentially formed in each capacitor recess 134. In the present embodiment, the electrode material layer 136 is made of, for example, titanium nitride (TiN). The material of the protection layer 138 comprises such as silicon oxide. The purpose for forming the protection layer 138 is to cover the surface of the electrode material layer 136, so as to prevent the electrode material layer 136 from being damaged in the subsequent etching steps and affecting the quality of each lower electrode of the capacitor structure. Then, as shown in FIG. 8, an etching step P5 is performed to remove part of the protection layer 138 and the electrode material layer 136, and to form an U-shaped cross-section electrode material layer 136 in each capacitor recess 134. At this step, the remaining electrode material layer 136 is defined as a lower electrode 140 of the capacitor structure.

Figure 9:
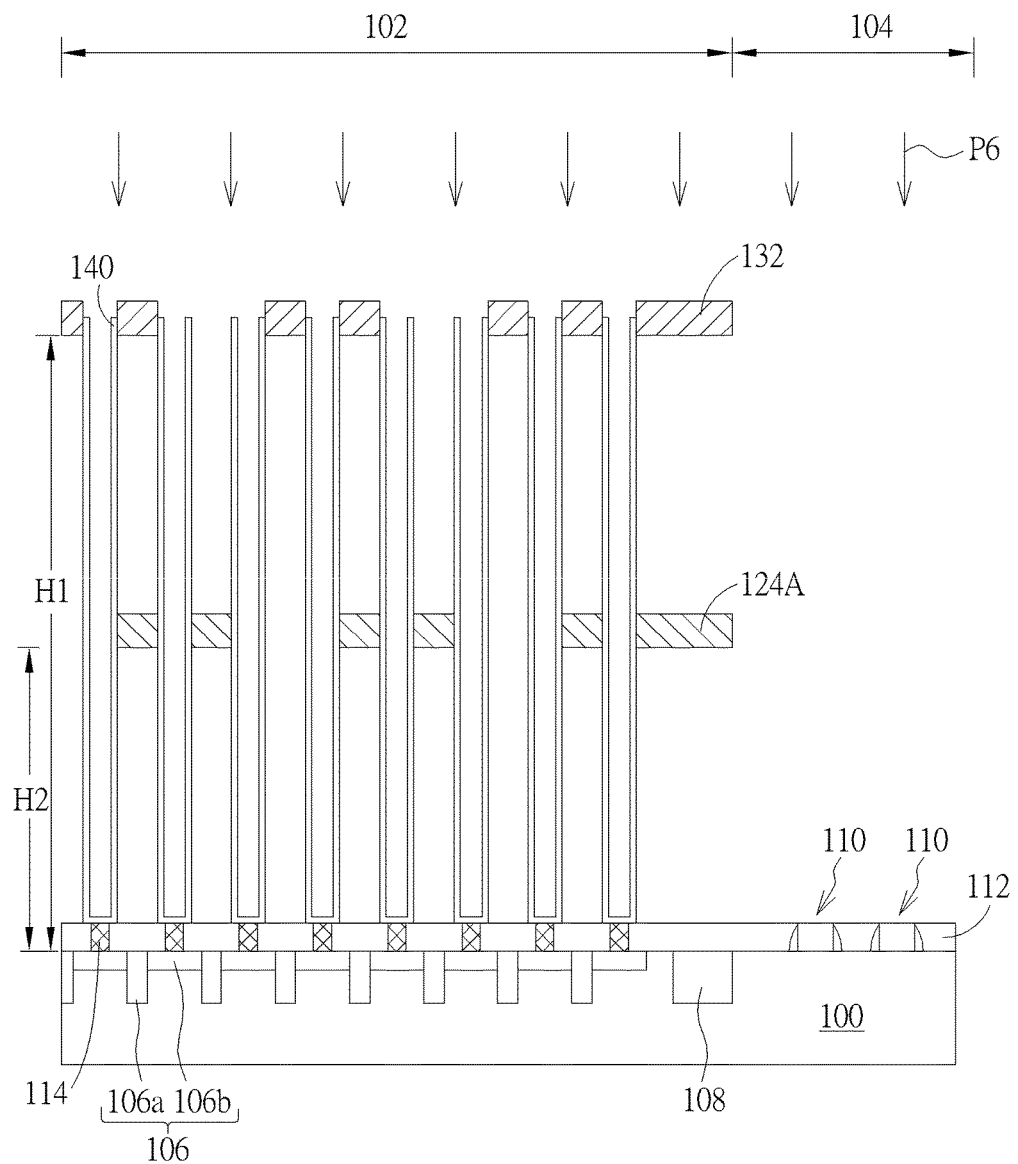

Finally, as shown in FIG. 9, an etching step P6 is performed to remove the remaining protection layer 138, the third oxide layer 126, the second oxide layer 118, and the first oxide layer 118. In this embodiment, the etching step P6 is, for example, soaking in a hydrofluoric acid (HF) solution. The etching step P6 can effectively remove the oxide layer. Therefore, after the etching step P6 is performed, only the lower electrodes 140 of the capacitor structures, the middle support structure layer 124 and the upper support structure layer 132 are remained on the dielectric layer 112 (the material of the dielectric layer 112 comprises such as silicon nitride).

It is worth noting that the middle support structure layer 124 is located substantially in a middle portion of the entire lower electrode 140 of the capacitor structure. Preferably, if the vertical height from a top surface of the substrate 100 to the top surface of the upper support structure layer 132 is defined as H1, and the vertical height from a top surface of the substrate 100 to the top surface of the middle support structure layer 124 is defined as H2, in this embodiment, H2/H1 is between 0.4 and 0.6.

Figure 10:
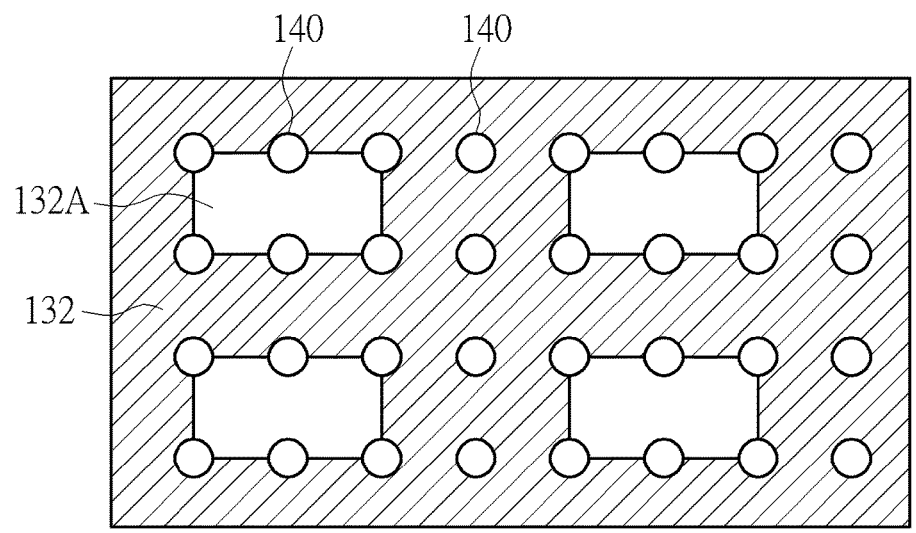
FIG. 10 shows a top view of the semiconductor structure of the present invention, and in particular shows the top views obtained along the cross-sectional lines A-A' and B-B' of FIG. 9 respectively.
Figure 10:
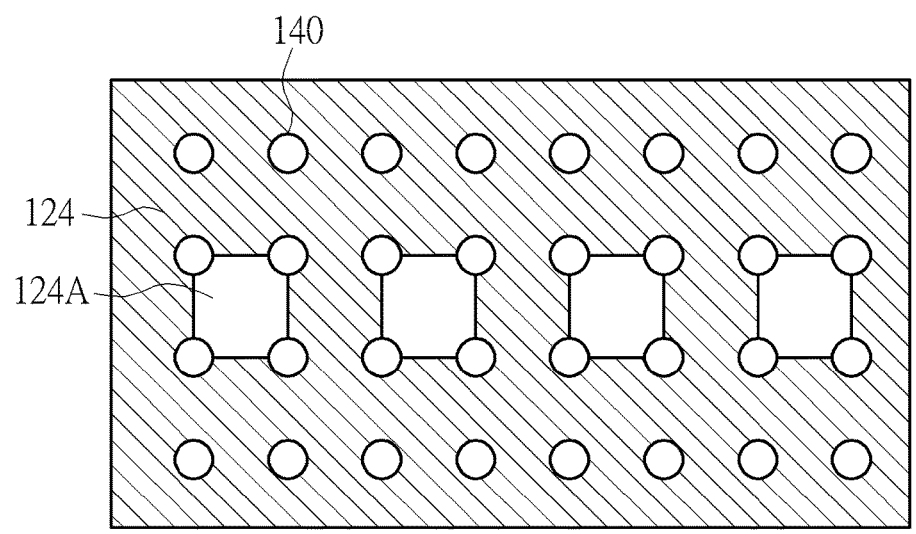

In addition, FIG. 10 shows a top view of the semiconductor structure of the present invention, and in particular shows the top views obtained along the cross-sectional lines A-A' and B-B' of FIG. 9 respectively. As shown in FIG. 10, the upper support structure layer 132 contacts the plurality of lower electrode 140 of the capacitor structure, and includes a plurality of first openings 132A, and the middle support structure layer 124 also contacts the plurality of lower electrode 140 of the capacitor structure, and includes a plurality of second openings 124A, the positions of the first openings 132A and the second openings 124B do not overlap each other. In addition, the number of the first openings 132A contacting the lower electrodes 140 of the capacitor structure and the number of the second openings 124A contacting the lower electrodes 140 of the capacitor structure are also different. For example, in the present embodiment, each first opening 132A contacts six lower electrodes 140, and each second opening 124A contacts four lower electrodes 140. However, the number of each first opening and/or each second opening contacting the lower electrodes mentioned above is not limited thereto. As a result, the upper support structure layer 132 and the middle support structure layer 124 will be staggered and support each lower electrode 140, further enhancing the effect of supporting the lower electrodes 140 of the capacitor structures.

The present invention is characterized in that a semiconductor structure is fabricated, which at least comprises a plurality of lower electrodes of the capacitor structures, an upper support structure layer and a middle support structure layer, the upper support structure layer and the middle support structure layer respectively support the upper portion and the middle portion of a lower electrode of the capacitor structure, to prevent the lower electrode of the capacitor structure from collapsing. In addition, from the top view, the upper support structure layer and the middle support structure layer do not completely overlap with each other, thereby further enhancing function for supporting the lower electrode. In addition, during the manufacturing process, only one wet etching step (e.g., hydrofluoric acid) is performed, so damage to the lower electrode of the capacitor structure can also be reduced.

Figure 11:
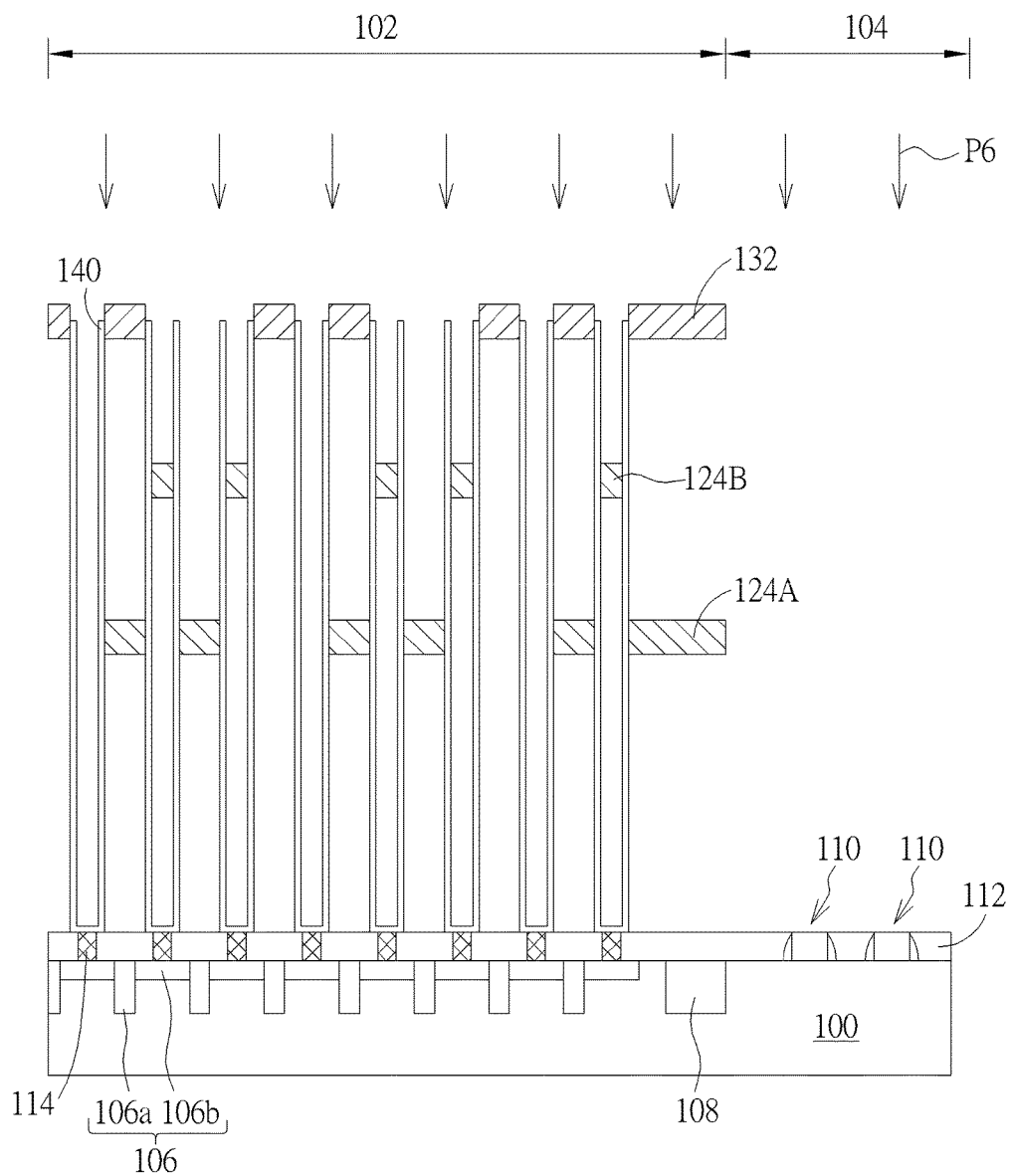
FIG. 11 shows a schematic diagram of a semiconductor structure according to another embodiment of the present invention.

In other embodiments of the present invention, as shown in FIG. 11, FIG. 11 shows a schematic diagram of a semiconductor structure according to another embodiment of the present invention. In this embodiment, a plurality of middle support structure layers can also be fabricated. For example, the middle support structure layer 124A and the middle support structure layer 124B are both on the sides of the lower electrode 140 to further support the capacitor structure. In addition, the middle support structure layer 124A and the middle support structure layer 124B may overlap or not overlap each other, and the present invention is not limited thereto. It can be understood that in other embodiments of the present invention, more than three middle support structure layers can also be produced, which should also be within the scope of the present disclosure.

In the process of fabricating the semiconductor structure according to the present invention, the support structure layer 124 is first patterned (see FIG. 2), then the upper support structure layer 132 is patterned (see FIG. 4), and the capacitor recesses 134 and the electrode material layer 136 are formed (refer to FIG. 6 to FIG. 7), finally an etching step is performed to complete the lower electrode 140 (refer to FIG. 9). However, in other embodiments of the present invention, the same semiconductor structure may also be formed in different process sequences. For example, in another embodiment of the present invention, the support structure layer is also patterned firstly, but after the second support material layer is formed (please refer to FIG. 3), a plurality of capacitor recesses are formed, and an electrode material layer and a protection layer are then formed in each capacitor recess, afterwards, a patterning step is performed, so as to form an upper support structure layer, and an etching step is performed to complete the semiconductor structure shown in FIG. 9. In other words, in this embodiment, the step of patterning the upper support structure layer is performed after the electrode material layer is formed. This production process should also be within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate having a cell region defined thereon;
   a plurality of lower electrode structures located in the cell region;
   an top support structure, contacting a top region of the lower electrode structure; and
   at least one middle support structure located between the substrate and the top support structure, contacting a middle region of the lower electrode structure, wherein when viewed in a top view, the top support structure and the middle support structure do not completely overlapped with each other, wherein a vertical height from a top surface of the substrate to the upper support structure is H1, and a vertical height from the top surface of the substrate to the middle support structure is H2, and wherein H2/H1 is between 0.4 and 0.6.

2. The semiconductor structure of claim 1, wherein a material of the upper support structure comprises nitrogen silicon carbide (SiCN), silicon nitride (SiN) and silicon oxynitride (SiON).

3. The semiconductor structure of claim 1, wherein a material of the middle support structure comprises nitrogen silicon carbide (SiCN), silicon nitride (SiN) and silicon oxynitride (SiON).

4. The semiconductor structure of claim 1, wherein a material of the upper support structure comprises a plurality of first openings.

5. The semiconductor structure of claim 4, wherein the middle support structure comprises a plurality of second openings, wherein the positions of the first openings and the positions of the second openings do not overlap with each other.

6. The semiconductor structure of claim 4, wherein each of the first openings overlaps with X lower electrode structures, and each of the second openings overlaps with Y lower electrode structures, wherein X is not equal to Y.

7. The semiconductor structure of claim 1, further comprising a plurality of buried word line structures in the substrate of the cell region.

8. The semiconductor structure of claim 7, further comprising a first dielectric layer in the substrate, and the lower electrode structure is disposed on the first dielectric layer.

9. The semiconductor structure of claim 8, further comprising a plurality of contact structures in the first dielectric layer and electrically connected to the buried word line structures and the lower electrode structure.

10. The semiconductor structure of claim 1, wherein a material of the lower electrode structure comprises titanium nitride.

11. The semiconductor structure of claim 1, wherein the at least one middle support structure comprises more than two middle support structures.

* * * * *